United States Patent
Gibson et al.

(10) Patent No.: US 7,570,679 B2
(45) Date of Patent: Aug. 4, 2009

(54) WIDE TEMPERATURE RANGE UNCOOLED TRANSCEIVER MODULE FOR UNCONTROLLED ENVIRONMENTS

(75) Inventors: Peter Gibson, Suffolk (GB); Michael Stimson, Bury St. Edmunds (GB)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 11/677,548

(22) Filed: Feb. 21, 2007

(65) Prior Publication Data

US 2007/0195838 A1 Aug. 23, 2007

Related U.S. Application Data

(60) Provisional application No. 60/743,334, filed on Feb. 22, 2006.

(51) Int. Cl.
*H01S 3/04* (2006.01)
(52) U.S. Cl. .............. 372/36; 372/38.02; 372/43.01
(58) Field of Classification Search .............. 372/36, 372/38.02
See application file for complete search history.

(56) References Cited

U.S. PATENT DOCUMENTS

| 4,399,541 | A |   | 8/1983  | Kovats et al. |
| 5,406,172 | A | * | 4/1995  | Bennett ............ 315/112 |
| 5,740,191 | A | * | 4/1998  | Kasper et al. ............ 372/34 |
| 6,147,795 | A |   | 11/2000 | Derbyshire et al. |
| 6,185,232 | B1 |  | 2/2001  | Hess, Jr. et al. |
| 6,546,034 | B2 |  | 4/2003  | Komori et al. |
| 6,757,499 | B1 |  | 6/2004  | Aoki |
| 6,801,557 | B2 |  | 10/2004 | Liu |
| 6,826,212 | B2 |  | 11/2004 | Shirai et al. |
| 6,868,104 | B2 |  | 3/2005  | Stewart et al. |
| 6,977,949 | B2 |  | 12/2005 | Saito |
| 7,009,716 | B2 |  | 3/2006  | Kim et al. |
| 7,013,055 | B2 |  | 3/2006  | Hayamizu et al. |
| 2002/0136247 | A1 | | 9/2002 | Ikeda et al. |

(Continued)

FOREIGN PATENT DOCUMENTS

EP 0644669 A1 3/1995

OTHER PUBLICATIONS

"IPC800067 EDFA Controller", source(s): http://www.photonicscontrol.com/design_licenses/CDS3002%20DualStage%20VGA%20EDFA%20Controller%20Datasheet.pdf.

(Continued)

*Primary Examiner*—Dung T Nguyen
(74) *Attorney, Agent, or Firm*—Barlow, Josephs & Holmes, Ltd.

(57) ABSTRACT

A laser transmitter within an optical transceiver includes a heating element. The heating element is coup led to the laser package and is controlled to allow the laser to be heated to a higher temperature than the ambient temperature when low environmental temperature extremes occur. The transmitter includes a semiconductor laser having an optimal operational temperature range, a laser driver circuit coupled to the laser that provides a modulation current and a bias current to drive the laser, a heating element thermally coupled to the laser and a heating control circuit that monitors the bias current applied to the laser for drops in bias current that are indicative of drops in the surrounding ambient temperature. In response to a drop in bias current, the control circuitry energizes the heating element to provide heat to the laser.

11 Claims, 2 Drawing Sheets

U.S. PATENT DOCUMENTS

2003/0072336 A1    4/2003    Senapati et al.
2003/0227694 A1    12/2003    Hosoya et al.
2004/0184494 A1    9/2004    Harker et al.
2005/0018721 A1    1/2005    Kish, Jr. et al.
2005/0135442 A1    6/2005    Kropp
2005/0286909 A1    12/2005    Kish, Jr. et al.

OTHER PUBLICATIONS

Oh, Lee, Le, Kang, Yoo, "A CMOS Burst-Mode Optical Transmitter for 1.25-Gb/s Ethernet PON Applications", IEEE Transactions on Circuits and Systems, II: Express Briefs, vol. 52, No. 11, Nov. 2005—source(s): http://rfernos.ieu.ac.kr/pdf/journals/2005/5.pdf -.

* cited by examiner

WIDE TEMPERATURE RANGE UNCOOLED TRANSCEIVER MODULE FOR UNCONTROLLED ENVIRONMENTS

CROSS-REFERENCE TO RELATED APPLICATIONS

This application is related to and claims priority from earlier filed U.S. Provisional Patent Application No. 60/743,334, filed Feb. 22, 2006, the contents of which are incorporated herein by reference.

BACKGROUND OF THE INVENTION

The present invention relates generally optical transceiver devices for use in uncontrolled environmental conditions. More particularly, the present invention relates to controlling the operating wavelength tolerances of a Coarse Wavelength Division Multiplexed (CWDM) transceiver in an uncontrolled environment that may have an environmental temperature range of between −40° C. to 85° C.

It is known in the prior art that there is a need to maintain a laser device such, as an optical transmitter, at a relatively stable and constant temperature in order to optimize its performance characteristics and to maintain the output of the transmitter within a desired operational wavelength range. In this regard, semiconductor lasers used in optical transmitters have traditionally been packaged with thermoelectric climate control devices that are controlled and dynamically switched between a cooling mode and a heating mode. Such thermoelectric climate control devices were critical in the prior art in order to maintain the semiconductor laser at a constant temperature. The drawback to this packaging arrangement was that the size and power consumption of the optical transmitter package was greatly increased.

In order to reduce the cost, size, and power dissipation of these optical transmitter packages, there have been efforts to improve the performance of the laser diodes themselves by increasing their operational temperature ranges while maintaining their wavelength tolerances, thereby allowing them to be used without thermoelectric coolers over a wider temperature range. As a result of these efforts, relatively good performance wide temperature range lasers are now available and are used in many uncontrolled environmental applications.

Even with the improvements in the laser diodes, however, there are still significant performance issues related to lasers that operate in cold environments thereby creating the need for heating. For example, in the operation of CWDM transceivers, the allowed standard for wavelength tuning is 13 nm. The problem is that an uncooled distributed feedback (DFB) laser typically used in CWDM transceivers has a wavelength variation of 12.5 nm over the operational temperature range of between about −40° C. to 85° C. This 12.5 nm variation in laser wavelength leaves only a very small tolerance for the wavelength selection of the DFB laser. Accordingly, there is less than a 0.5 nm window available for selection of the initial wavelength of the DFB laser, a window that simply cannot currently be achieved with consistent results.

Even if it were possible to achieve consistent results within the available 0.5 nm selection window, various physical phenomena that have deleterious effects on laser performance are amplified at the lower end of the stated operational temperature range. For example, the pattern dependent turn-on delay increases significantly at low temperatures causing additional timing jitter. In addition, mode partitioning in DFB lasers, which are designed to operate over a wide temperature range, increases at low temperatures possibly resulting in an excessive dispersion penalty for the entire system.

There is therefore a need for an optical transceiver that has a reduced package size and power consumption as compared to prior art temperature controlled optical transceivers. The is a further need for an optical transceiver that is capable of operating in uncontrolled environmental conditions while also being capable of meeting the required 13 nm tolerances set forth in the CDWM standards. Finally there is a need for an optical transceiver that exhibits an improved performance by limiting the environmental temperature range under which the laser must operate through a means that is compact and highly efficient.

BRIEF SUMMARY OF THE INVENTION

In this regard, the present invention provides for a laser transmitter component within the optical transceiver that includes a small heating element. In accordance with the present invention a laser transmitter is provided that includes a heating element that is coup led to the laser package and is controlled to allow the laser to be heated to a higher temperature than the ambient temperature when low environmental temperature extremes occur. More particularly, the laser transmitter portion of the optical transceiver includes a semiconductor laser having an optimal operational temperature range, a laser driver circuit coupled to the semiconductor laser that provides a modulation current and a bias current to drive the semiconductor laser, a heating element thermally coup led to the semiconductor laser and a heating control circuit that monitors the bias current applied to the laser. The heating control circuit is programmed to look for drops in bias current, which are known to be indicative of drops in the surrounding ambient temperature. In response to a drop in bias current, the control circuitry energizes the heating element to provide heat to the semiconductor laser.

Key features of the laser transmitter component of the present invention include: the application of a heater directly to a laser utilized in an optical transceiver, such as CWDM transceivers; an improved heating efficiency that is achieved by wrapping the heater around the coaxial laser while leaving a substantial portion of the laser exposed; use of a flexible heater wrapped around the body of the coaxial laser; and the control of the heater responsive to changes in bias current readings from diagnostic monitoring of the laser.

Accordingly, it is an object of the present invention to provide a laser transmitter that includes a heater component, which in turn maintains the laser at an environmental temperature that optimizes the laser output performance. It is a further object of the present invention to provide a laser transmitter component that includes a high efficiency flexible heater wrapped around an exterior surface thereof to maintain the laser at an environmental temperature that optimizes the laser output performance. Finally, it is an object of the present invention to provide a laser that includes a high efficiency heater that is controlled using a feedback loop that monitors drops in the bias current applied to the laser and energizes the heater in response to those drops.

These together with other objects of the invention, along with various features of novelty that characterize the invention, are pointed out with particularity in the claims annexed hereto and forming a p art of this disclosure. For a better understanding of the invention, its operating advantages and the specific objects attained by its uses, reference should be had to the accompanying drawings and descriptive matter in which there is illustrated a preferred embodiment of the invention.

BRIEF DESCRIPTION OF THE DRAWINGS

In the drawings which illustrate the best mode presently contemplated for carrying out the present invention.

DETAILED DESCRIPTION OF THE INVENTION

Figure 3:
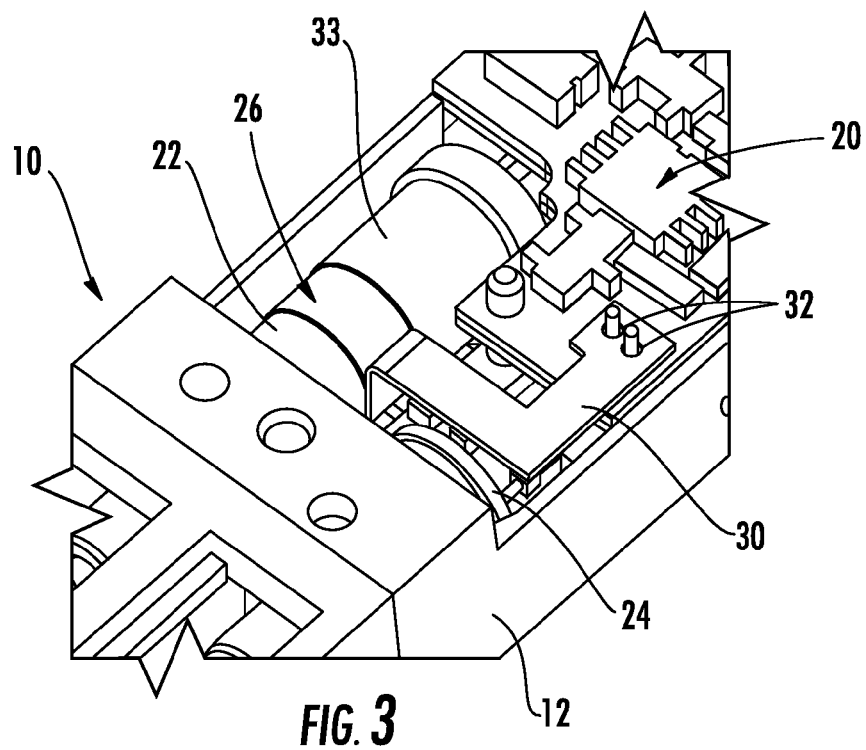
FIG. 3 is a perspective view of the coaxial laser and heater subassembly contained within a pluggable optical transceiver.

Now referring to the drawings, a pluggable optical transceiver module in accordance with the teachings of the present invention is illustrated and generally indicated at 10 in FIG. 3. The pluggable optical transceiver module 10 includes a housing generally indicated at 12. The transceiver module 10 shown in FIG. 3 is a transceiver capable of transmitting and receiving signals over a pair of coupled fiber optic transmission cables. The transceiver module 10 includes an optical subassembly generally indicated at 20 that includes an optical transmitter (TX) 22 in the form of a coaxial semiconductor laser and an optical receiver (RX) 24 such as a photodiode. The optical sub-assembly 20 shown in FIG. 3 is one example of a unit that can be installed in the optical transceiver module 10 of this invention and is shown for illustration purposes only. It is recognized that other optical subassembly units having different configurations can be installed in the optical transceiver 10 in accordance with the teachings of this invention.

Figure 1:
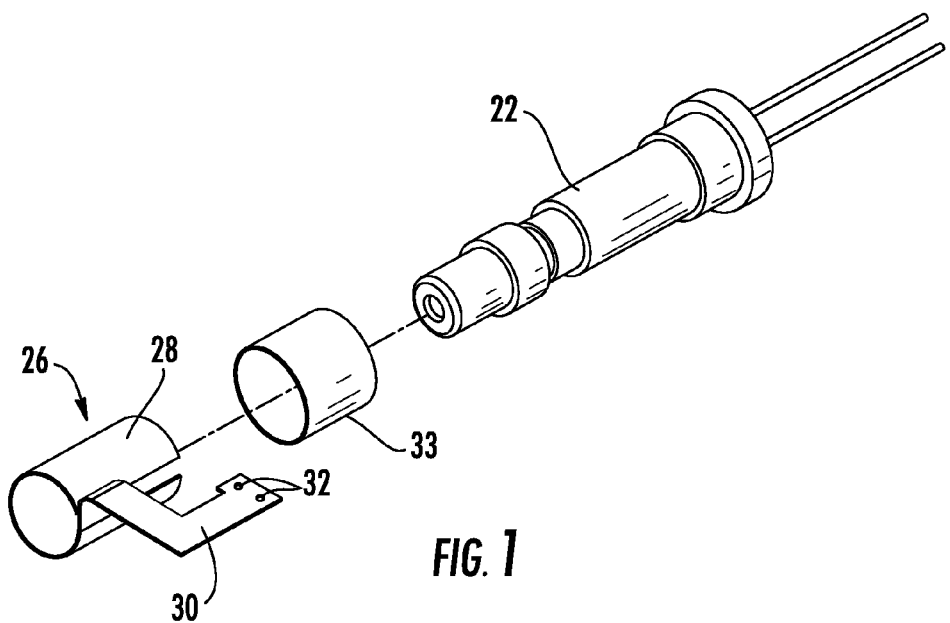
FIG. 1 is an exploded perspective view of coaxial laser and heater element of the present invention.
Figure 2:
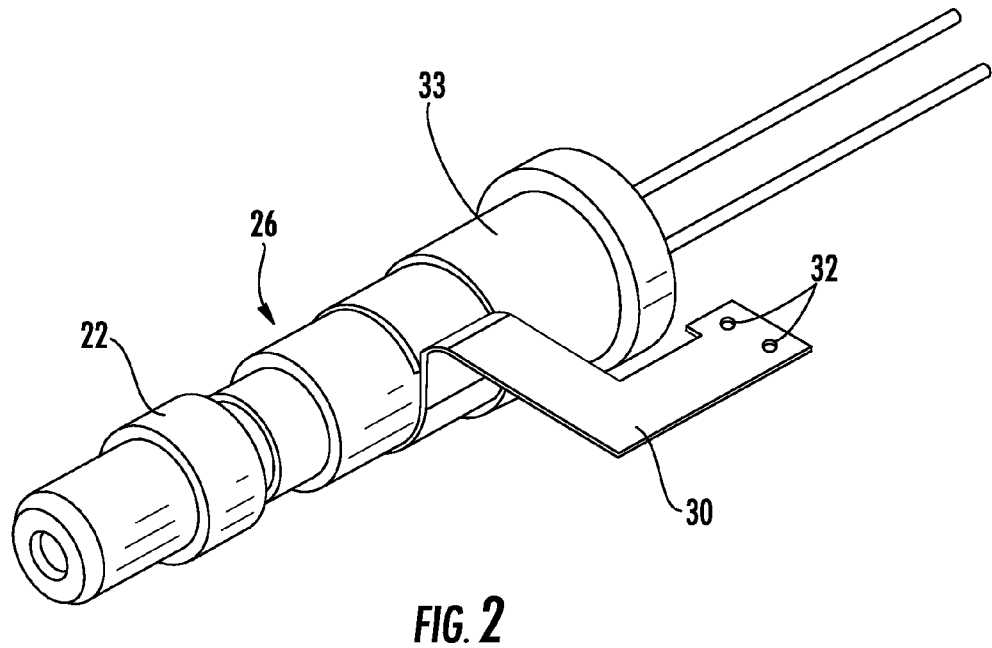
FIG. 2 is a perspective view of the heater installed adjacent the coaxial laser.

Turning now to FIGS. 1 and 2, the improved optical transmitter arrangement of the present invention includes a heater shown at 26. A heater 26 is provided that wraps around the coaxial laser 22 and is activated to counteract low environmental temperatures through the use of control circuitry as will be described below in detail. The heater 26 is a resistive heating element that provides enough heat input to the laser 22 to return the laser 22 to a more suitable environmental temperature thereby increasing the operational wavelength tolerance window of the laser 22. By expanding the operational wavelength tolerance of the laser 22, greater latitude is provided when determining the initial frequency tuning for the laser 22 while remaining within the required 13nm operational requirement.

In one preferred embodiment of the heater 26, a flexible heater element 28 is provided that effectively wraps around the exterior surface of the body of the coaxial laser 22. A contact arm 30 extends from the flexible heater element 28 and terminates in two connection points 32 that allow the heater 26 to be electrically connected to the control circuitry within the transceiver housing 12. This connection allows the heater 26 to interface with the control within the packaged device thereby allowing selective operation of the heater 26 as needed. It can also be seen that in order to improve the conduction of heat into the laser 22, an insulation layer 33 may be wrapped around the flexible heater 26 thereby retaining the heat generated and directing it inwardly to the laser package 22.

In the preferred embodiment, control of the heater activation is based on monitoring of the bias current applied to the laser 22 via the feed back in the laser control loop. This is based on the fact that decreases in laser driver bias are necessary as the environmental temperature drops in order to maintain a constant laser output level. Accordingly, decreases in bias current can approximate the drops in the surrounding environmental temperature and provide sufficient feed back upon which to base control of the heater element 26. In other words, the automatic power control loop that is typically employed with lasers of this type, monitors the output of the laser and adjusts the bias applied to the laser in response to changes in laser power output. Typically, as the ambient temperature around the laser drops, the power output increases and therefore the bias must be reduced by the power control loop in order to maintain a constant laser power output.

Figure 4:
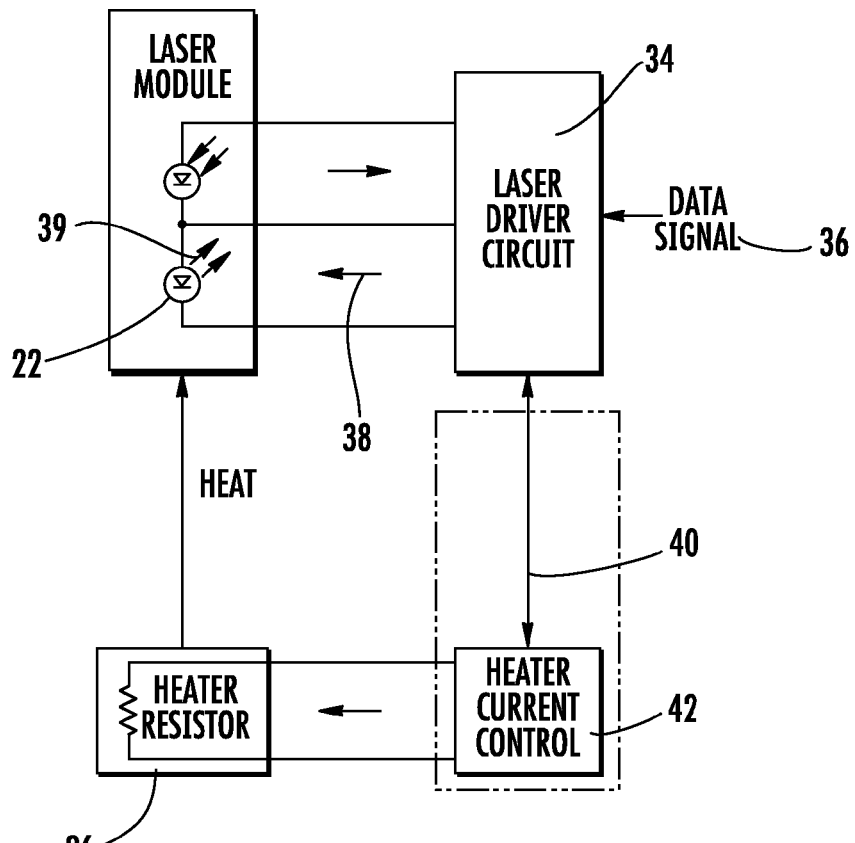
FIG. 4 is a schematic view of the heater driver circuitry of the present invention.

Turning to FIG. 4, a schematic diagram of the manner in which the control circuitry and heater interact is depicted. A laser driver circuit 34 receives an incoming data signal 36, converts it to a drive bias 38, which is in turn used to drive the laser 22 to generate an optical output 39. The laser driver 34 monitors the optical output 39 of the laser 22 so that the output signal 39 is maintained at a constant operational level. As the environmental temperature surrounding the laser 22 drops, the drive bias 38 applied to the laser 22 is decreased in order to maintain a constant state output. Input that is transmitted using this laser feedback loop is also transmitted as bias feedback 40 to the heater controller 42. Since decreases in drive bias 38 generally indicate dropping environmental temperatures, the heater control 42 activates the heater 26 surrounding the laser 22. As the laser 22 operating temperature increases, the level of bias 38 required to maintain a constant operational output increases and this increase in required bias is transmitted to the heater control to indicate that the heater 26 can be deactivated. Accordingly, based on the bias feedback loop within the laser drive 24, the heater control 42 modulates the operation of the heater 26 as needed.

The arrangement of the present invention is particularly useful in connection with DFB lasers and CWDM transceiver packages. Key points of novelty in the present invention include the application of a flexible resistance type heater 26 to a laser 22 utilized in an optical transceiver 10 while controlling the heater 26 through a monitoring circuit that utilizes a bias feedback loop that is already employed within the transceiver package as it is currently manufactured. The implementation of the flexible heater 26 in accordance with the present invention provides for an improvement in efficiency due to the fact that the heater 26 is wrapped directly around the coaxial laser package 22 while leaving a substantial portion of the laser 22 exposed.

It can therefore be seen that the present invention provides an improved pluggable optical transceiver package that exhibits greater performance stability even in unconditioned environments having temperature ranges of between about −40° C. to 85° C. small. Further the present invention provides an improved transceiver assembly that has improved performance within the desired range while also reducing the power consumption and size requirements of the package and utilizing existing circuitry within the package as a means for controlling the heater. For these reasons, the present invention is believed to represent a significant advancement in the art, which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:

1. An optical transmitter comprising:
   a semiconductor laser having a package that includes an outer surface and an optimal operating temperature range;
   a heating element disposed about said outer surface of said semiconductor laser;
   a laser driver circuit configured and arranged to apply a selective bias current to said semiconductor laser to maintain output from said laser at a predetermined constant level; and
   a heating control circuit that monitors said bias current applied to said semiconductor laser and energizes said heating element in response to a drop in said bias current.

2. The optical transmitter of claim 1, wherein said heating element is a flexible resistive heating element.

3. The optical transmitter of claim 1, wherein said laser drive circuit monitors output from said semiconductor laser and adjusts said bias current to maintain said output at a constant level.

4. The optical transmitter of claim 1, wherein said heating element is a resistive heater, and said heating control circuit controls a current conducted by said resistive heater in response to changes in said bias applied to said semiconductor laser.

5. The optical transmitter of claim 1, wherein said semiconductor laser is a distributed feedback laser.

6. The optical transmitter of claim 1, further comprising:
   a housing, said optical transmitter, said heating element, said laser driver and said heating control circuit a received within said housing.

7. A laser transmitter comprising:
   a housing;
   a semiconductor laser disposed within said housing said semiconductor laser having an optimal operating temperature, said semiconductor laser selectively outputting coherent radiation having a wavelength that changes with decreases in said operating temperature;
   a driver circuit disposed within said housing, said driver circuit configured and arranged to apply a selective bias current to said semiconductor laser to maintain output from said laser at a predetermined constant level;
   a heating element thermally coupled to said semiconductor laser; and
   a heating control circuit mounted in said housing, said heating control circuit monitoring said bias current applied to said semiconductor laser and energizes said heating element in response to a drop in said bias current to provide heat to said semiconductor laser, thereby limiting the variation in said wavelength output by said semiconductor laser.

8. The laser transmitter of claim 7, wherein said heating element is a flexible resistive heating element.

9. The laser transmitter of claim 7, said semiconductor laser having an outer housing, said heating element being installed on an outer surface of said outer housing.

10. The laser transmitter of claim 9, wherein said heating element is a flexible resistive heating element that is wrapped around said outer housing.

11. The laser transmitter of claim 7, wherein said semiconductor laser is a distributed feedback laser.

* * * * *